United States Patent [19]
Johnson et al.

[11] Patent Number: 5,384,231
[45] Date of Patent: Jan. 24, 1995

[54] FABRICATING LENS ARRAY STRUCTURES FOR IMAGING DEVICES

[75] Inventors: James A. Johnson, Leroy; Madhav Mehra, Rochester, both of N.Y.

[73] Assignee: Eastman Kodak Company, Rochester, N.Y.

[21] Appl. No.: 111,361

[22] Filed: Aug. 24, 1993

[51] Int. Cl.⁶ .............................................. G03F 7/26
[52] U.S. Cl. .................................. 430/321; 156/643; 437/228
[58] Field of Search ................ 430/321, 4, 7, 330; 156/643; 437/228; 250/208.1

[56] References Cited

U.S. PATENT DOCUMENTS 4,966,831 10/1990 Mehra et al. .................. 430/321
5,204,288 4/1993 Marks et al. .................. 437/228

OTHER PUBLICATIONS

Marks et al, In Situ Planarization of Dielectric Surfaces Using Boron Oxide, 1989 6th International IEEE VLSI Multilevel Interconnection Conference, vol. 1, No. 1, Jun. 1989.

Primary Examiner—Charles L. Bowers, Jr.
Assistant Examiner—John A. McPherson
Attorney, Agent, or Firm—Raymond L. Owens

[57] ABSTRACT

A method of forming a planarized layer on a CCD device to permit a lens array to be formed which includes etching a $B_2O_3$ layer provided on a conformally coated $SiO_2$ layer until a sufficient amount of the deposited $B_2O_3$ layer is removed to provide a planarized surface.

2 Claims, 3 Drawing Sheets

FABRICATING LENS ARRAY STRUCTURES FOR IMAGING DEVICES

FIELD OF THE INVENTION

The present invention relates to making stable lens arrays for imaging devices.

BACKGROUND OF THE INVENTION

Image sensing devices made up of an array of laterally spaced sensors are well known and can take a variety of forms. The array can be viewed as being made up of a number of laterally offset regions, commonly referred to as pixels or sensing elements. The art has recognized that sensing advantages can be realized by forming a lens array having a convex lens or lenslets for each pixel.

A lenticular array placed in registration with the device serves to focus the incident light upon the photodiodes. One lenslet for each photodiode. This has the effect of increasing the light gathering area of each photodiode and hence improving the signal.

The device necessarily has to have a lens supporting structure. A color filter array may be provided on such structure. In any event, it is important that the structure have a planarized surface so that the lenses can be very accurately positioned.

A planarized surface is desirable in the manufacturing of lenslets for several reasons. By eliminating, or at least greatly reducing the topography, the ability of the photolithography processes to successfully pattern subsequent layers in the fabrication process is greatly enhanced.

SUMMARY OF THE INVENTION

It is an object of this invention to fabricate stable lenses upon an effective planarizing layer on an image sensing device.

This object is achieved in a method of forming an integral lens assembly on a light-sensitive device such as an interline CCD, which device defines a plurality of sensing elements, the lens array having a separate lens for each image sensing element, comprising the steps of:

a) conformally coating the device to provide a $SiO_2$ layer which has peaks and valleys;

b) depositing a layer of $B_2O_3$ at a temperature selected to cause the $B_2O_3$ to puddle and fill in all the valleys regions of the conformally coated layer;

c) plasma etching the conformally coated layer and the $B_2O_3$ layer at substantially the same rates until all of the deposited $B_2O_3$ layer is removed to provide a planarized surface on the conformally coated layer;

d) depositing and patterning an inorganic color filter array structure;

e) depositing an $SiO_2$ "seed" layer;

f) lithographically defining and plasma etching a seed structure;

g) depositing a thick, conformal $SiO_2$ layer over the seed structure; and h) isotropically etching back to the lenslet structure.

The topography at the end of conventional fabrication provides a cross-section which is basically the inverse of the desired topographical cross-section which exists at the end of the lenslet fabrication sequence. It is much easier to invert this topography in stages rather than in one step. For the "seed" structure to work the lenslet "seed" should be the predominant feature present on the device surface.

Also, by going through a process which produces an intermediate step when the surface is planar, the fabrication of inorganic color filter arrays (CFAs) can be inserted into the lenslet process at this point. (A secondary planarization might be required after the formation of the inorganic CFAs introduces too much new topography).

The following are advantages found in devices made in accordance with this invention. A layer of $B_2O_3$ was chosen for the planarization process for several reasons. First, a set of deposition conditions exist in which the $B_2O_3$ will "flow" during the process. This eliminates the necessity of a subsequent step to accomplish the flowing of the material. Second, a set of processing conditions exist which provide similar etch rates for $B_2O_3$ and $SiO_2$. This similarity in etch rates is required for the planarizing sequence to work.

DETAILED DESCRIPTION OF THE PREFERRED EMBODIMENTS

Figure 1:
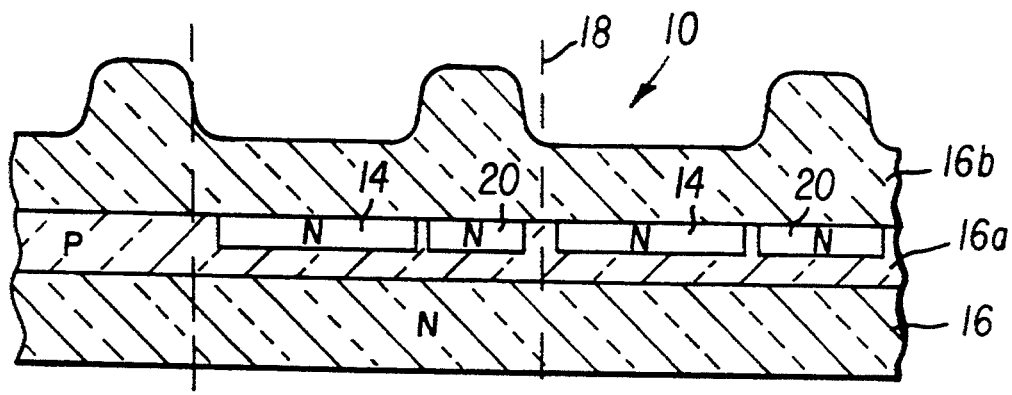
FIG. 1 is a plan view of a multipixel image sensor device.

In FIG. 1 a multipixel image sensor device 10 is shown by a plurality of laterally spaced photodiodes 14 on a substrate.

For clarity of illustration, the sensor device 10 and the layers which will be applied are not to scale. This device may be a conventional interline transfer device in which charge in each photodiode is transferred into an adjacent cell of a vertical CCD or charge coupled device.

Each photodiode 14 is positioned adjacent its upper surface and each peripherally defined by linear polygonal boundaries indicated by dashed lines 18.

Figure 2A:
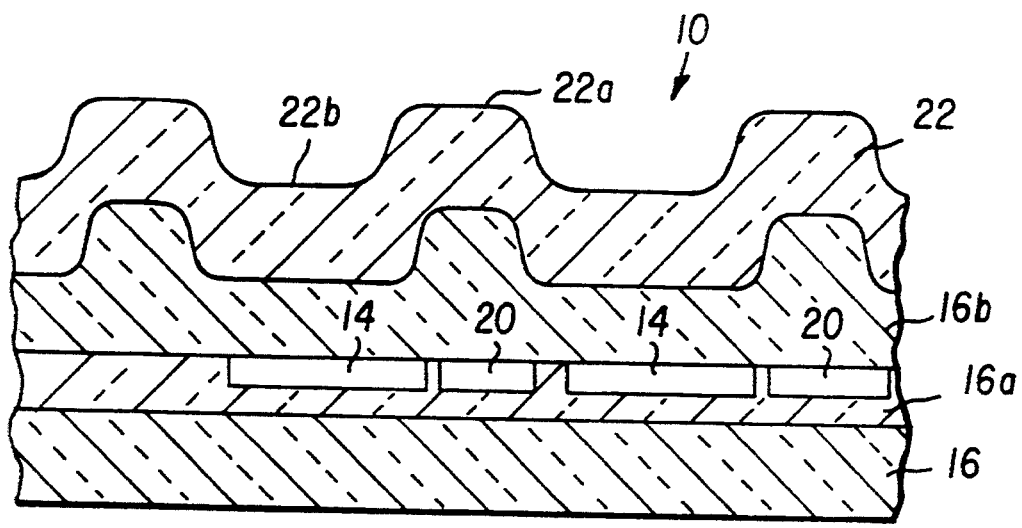
FIGS. 2a–h show various steps in the process of practicing a method according to this invention.

Turning now to FIG. 2a, there is shown a cross-section of the device upon which a planarizing layer and then a lens array will be formed in accordance with this invention. An n-type semiconductor substrate 16 typically a monocrystalline silicon substrate will be formed having a plurality of photodiodes formed in a p-well 16a, and in this arrangement, vertical CCD (charge coupled device) 20 formed adjacent to each column of photodiodes 14. As well be understood in the art various circuit elements are provide on p-well 16a. Layer 16b is a conventional passivation layer shown having a periodic topography was caused by circuit elements (not shown). The construction of this device has been shown only schematically and many of the device circuit elements have been omitted for clarity of illustration, but for a further and more complete description of a structure which shows the photodiodes and the vertical CCDs 20, as well as a lens array structure, reference is made to commonly assigned U.S. Pat. No. 4,966,831, issued Oct. 30, 1990 to Mehra et al., the disclosure of which is incorporated herein by reference.

In FIG. 2a a layer of silicon dioxide 22 has been deposited in a conventional manner and at a temperature low enough so as not to damage any of the device structure and to conformally coat the passivation layer 16b of the device. The $SiO_2$ layer 22 is shown (somewhat exaggerated) as having peaks 22a and valleys 22b. Preferably, this is accomplished by a conventional plasma enhanced CVD (chemical vapor deposition) at a temperature near 400° C. The CVD process used is a plasma enhance process which allows the use of tetraethyorthosilicate (TEOS) as the silicon source in the reaction in conjunction with oxygen to form $SiO_2$. TEOS is preferred over silane because it will give a more conformal deposition which will have better step converage and be less re-entrant at the base of vertical (or near vertical) steps. The thickness of this layer must be such that the bottom of the valleys is at a higher level than the highest topographic peak of passivation layer 16b.

Figure 2B:
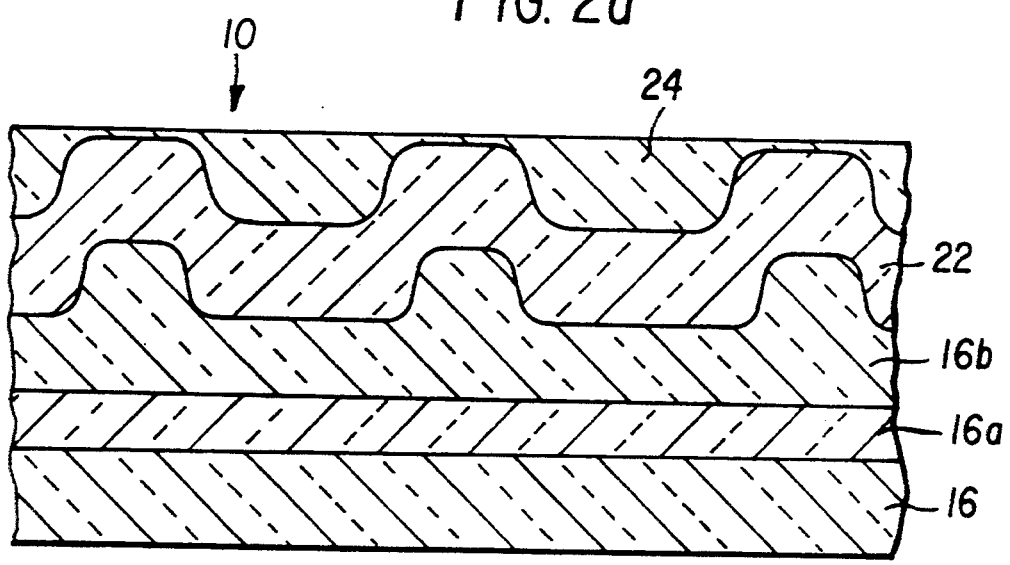

In FIG. 2b, a layer 24 of $B_2O_3$ is now deposited at a temperature hot enough to cause the $B_2O_3$ to puddle and fill in the valleys in the topography in the $SiO_2$ layer 22. This temperature is selected to be low enough to avoid damage to the device. The preferred temperature range is 390°–450° C. A layer of $B_2O_3$ was chosen for the planarization process for several reasons. First, a set of deposition conditions exist in which the $B_2O_3$ will "flow" during the process. This eliminates the necessity of a subsequent step to accomplish the flowing of the material. Second, a set of processing conditions exist which provide similar etch rates for $B_2O_3$ and $SiO_2$. This similarity in etch rates is required for the planarizing sequence to work.

Figure 2C:
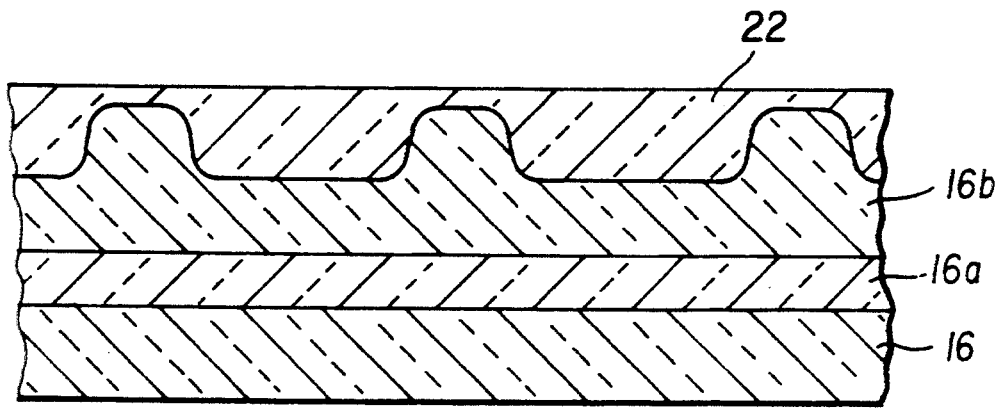

As shown in FIG. 2c, the image device is now etched back using the plasma etching process mentioned above. The etchant is selected so that the etch rate of the $B_2O_3$ and $SiO_2$ layers are substantially the same. The amount of etching is such that all of the $B_2O_3$ is removed producing a globally planarized surface on the $SiO_2$ layer 22. Plasma etching would occur in a single wafer system. $CHF_3$ when used in the proper pressure and RF power combination will form a plasma etch both $SiO_2$ and $B_2O_3$ at 3000 /min. The preferred pressure and power are 30 mTorr and 300–600 Watts. (See Marks et al, "In Situ Planarization of Dielectric Surfaces Using Boron Oxide", 1989 6th International IEEE VLSI Multilevel Interconnection Conference, Vol. 1, No. 1, June, 1989). Other planarizing etches can also be used. Moreover, a mechanical planarizing process may also be used.

A color filter array and a lens array now need to be added. This can be accomplished by a number of different techniques, some of which are shown in the above-referenced Mehra et al patent.

Figure 2D:
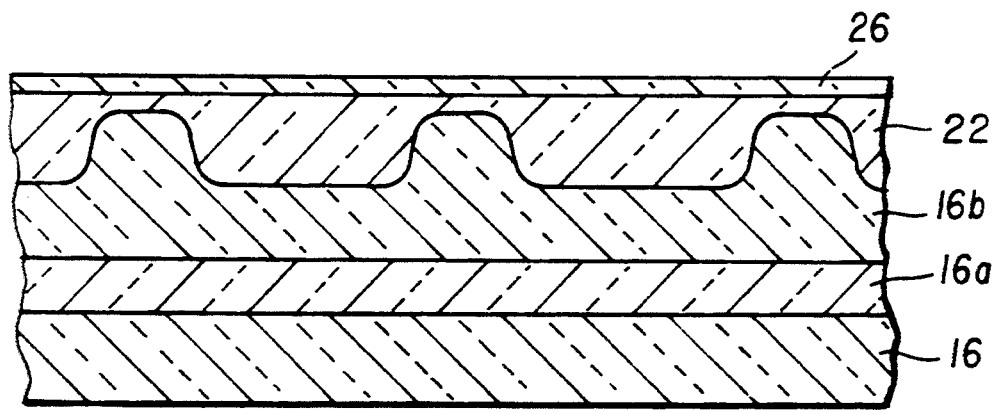
Figure 2E:
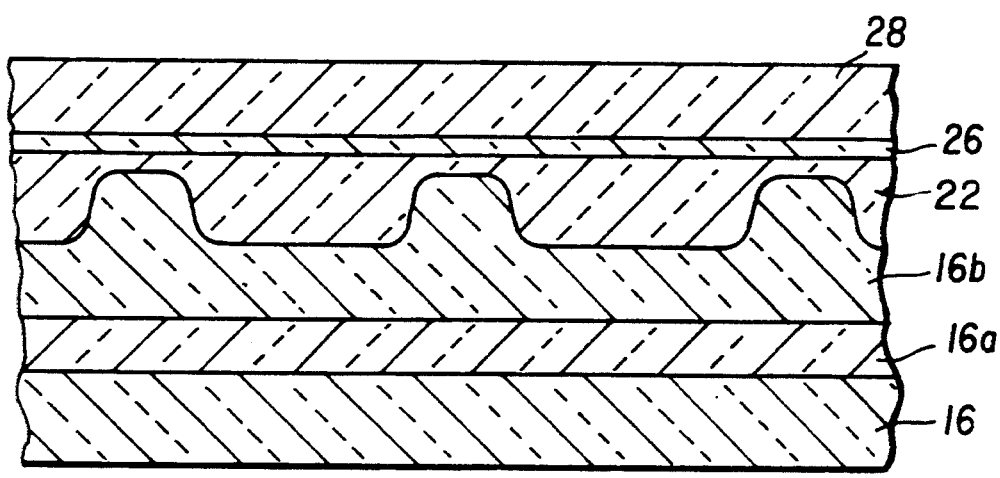
Figure 2F:
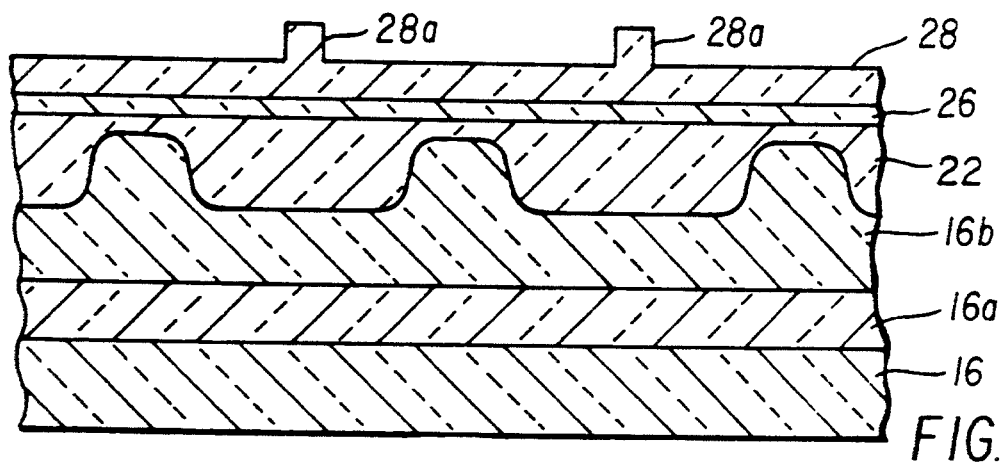

A color filter array 26 (CFA), in FIG. 2d such as a dichroic stack of layers then is provided on the etched $SiO_2$ layer 22. A seed layer 28 for forming a lens is then formed on the filter 26 (see FIG. 2e). The seed layer 28 is patterned by using a conventional anisotropic etch, such as, for example, $CHF_3$ and $O_2$. This patterning provides a rectangular cross-sectional seed portions 28a as shown in FIG. 2f. For example, the wafer is first coated with a positive photoresist, it is then exposed utilizing a photolithographic mask with the desired pattern on it. This is followed by a develop operation which removes the photoresist from the exposed areas. Thermal baking of the wafers to harden the resist to better withstand plasma conditions in the etch are also performed. The dimensions of the rectangular seed portions 28a are selected to give appropriate dimensions to the final lens array.

Figure 2G:
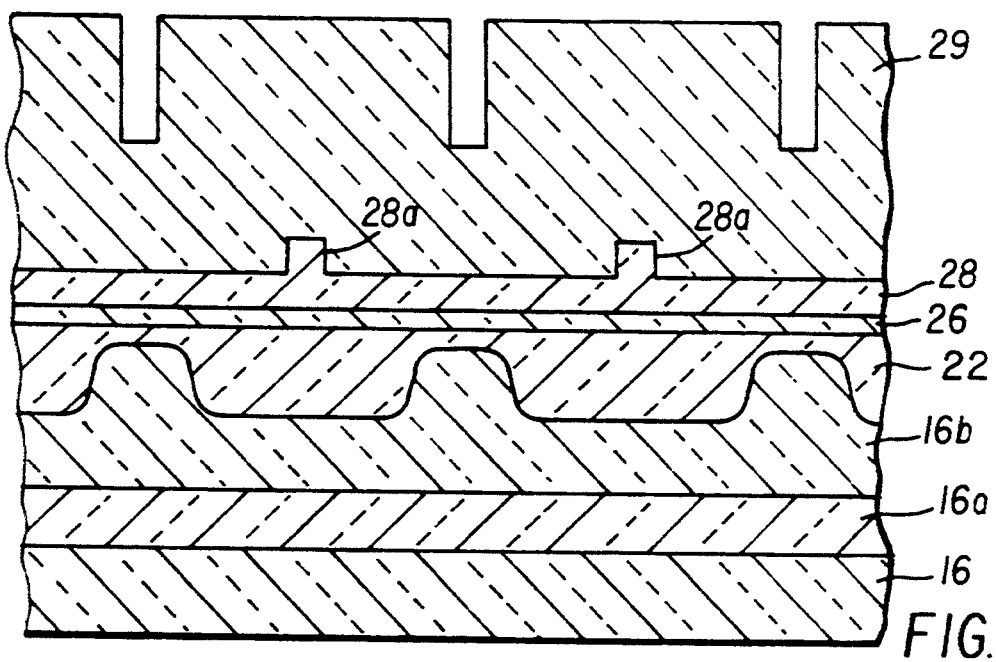
Figure 2H:
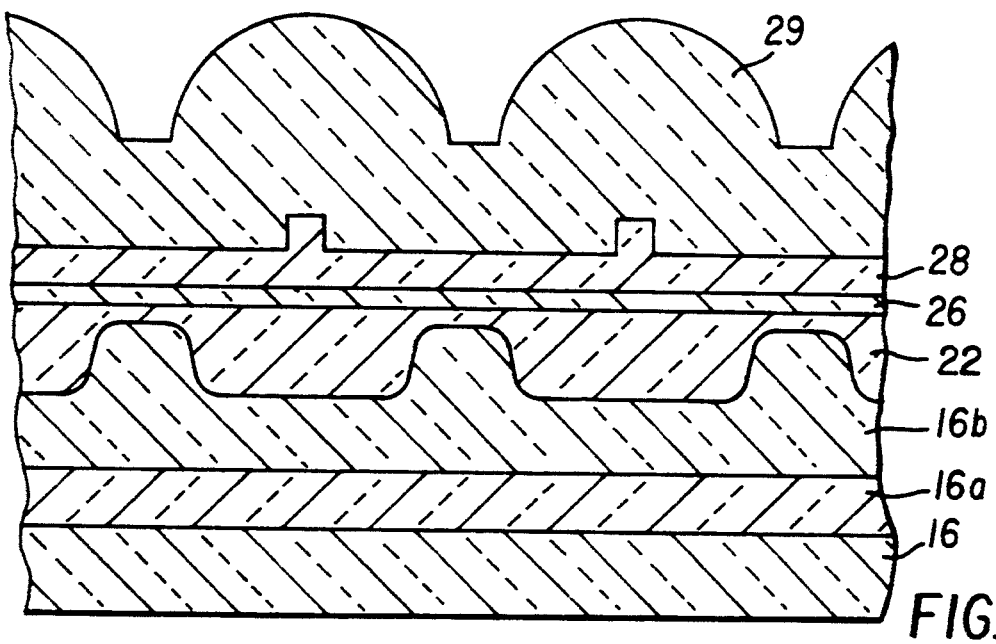

A conformal layer 29 of $SiO_2$ is now deposited on top of the seed portions 28a resulting in the structure as shown in FIG. 2g. As shown in FIG. 2h this structure is then isotropically plasma etched back to form an appropriate lens array of the appropriate shape. A plasma of $CHF_3$ can be used. Each lenslet is disposed over its corresponding photodiode 14. The $SiO_2$ layer 29 has, of course, been selected to be transparent to light which passes through the lenses and is focused on the photodiodes 14.

The planarized surface of $B_2O_3$ layer 24 is desirable in the manufacturing of lenslets for several reasons. By eliminating, or at least greatly reducing the topography, the ability of the photolithography processes to successfully pattern subsequent layers in the fabrication process is greatly enhanced. Inspection of the topography at the end of conventional fabrication indicates a cross-section which is basically the inverse of the desired topographical cross-section which exists at the end of the lenslet fabrication sequence. It is much easier to invert this topography in stages rather than in one step. For the proposed "seed portion 28" to work. The lenslet "seed" must be the predominant feature present at the surface or the approach will not be possible.

Also, by going through a process which produces an intermediate step when the surface is planar, the fabrication of inorganic color filter arrays can be inserted into the lenslet process at this point. (A secondary planarization might be required after the formation of inorganic CFA's if the introduced too much new topography).

The invention has been described in detail with particular reference to certain preferred embodiments thereof, but it will be understood that variations and modifications can be effected within the spirit and scope of the invention.

PARTS LIST 10. sensor device
14. photodiodes
16. semiconductor substrate
16a. p-well
16b. passivation layer
18. dashed line
20. charge coupled device
22. $SiO_2$ layer
22a. peaks
22b. valleys
24. $B_2O_3$ layer
26. stack of layers (filter array)
28. seed layer
28a. seed portions
29. $SiO_2$ layer

What is claimed is:

1. In a method of forming an integral lens assembly on a light-sensitive charge coupled device (CCD), which CCD defines a plurality of sensing elements, the lens array having a separate lens for each image sensing element, comprising the steps of:

a) conformally coating the CCD to provide an $SiO_2$ layer which has peaks and valleys;
   b) depositing a layer of $B_2O_3$ at a temperature selected to cause the $B_2O_3$ to puddle and fill in all the valleys of the conformally coated layer;
   c) plasma etching the conformally coated $SiO_2$ layer and the $B_2O_3$ layer at substantially the same rates until all of the deposited $B_2O_3$ layer is removed to provide a planarized surface on the conformally coated layer; and
   d) depositing and patterning an inorganic color filter array structure on said planarized surface;

e) depositing an SiO$_2$ "seed" layer on said color filter array;

f) lithographically defining and plasma etching a seed structure;

g) depositing a thick, conformal SiO$_2$ layer over the seed structure; and h) isotropically etching back to provide a lenslet structure.

2. In a method of forming an integral lens array on a light-sensitive charge coupled device (CCD), which CCD defines a plurality of sensing elements, the lens array having a separate lens for each image sensing element, comprising the steps of:

a) conformally coating the CCD to provide an SiO$_2$ layer which has peaks and valleys;

b) depositing a layer of B$_2$O$_3$ at a temperature selected to cause the B$_2$O$_3$ to puddle and fill in all the valleys regions of the conformally coated layer;

c) plasma etching the conformally coated SiO$_2$ layer and the B$_2$O$_3$ layer at substantially the same rates until a sufficient amount of the deposited B$_2$O$_3$ layer is removed to provide a planarized surface;

d) providing a color filter array on the planarized surface;

e) providing a second SiO$_2$ layer with seed portions on the color filter array; and f) forming a lens array on the second SiO$_2$ layer with each lens corresponding to a seed portion.

* * * * *